United States Patent
Goldman

(12) 
(10) Patent No.: US 6,459,342 B1
(45) Date of Patent: Oct. 1, 2002

(54) SYSTEM AND METHOD FOR CONTROLLING AN OSCILLATOR

(75) Inventor: Stanley J. Goldman, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/727,059

(22) Filed: Nov. 30, 2000

Related U.S. Application Data

(60) Provisional application No. 60/171,261, filed on Dec. 15, 1999.

(51) Int. Cl.$^7$ ................................................ H03L 7/099
(52) U.S. Cl. .................. 331/158; 331/116 FE; 331/116 R; 331/135; 331/34
(58) Field of Search .......................... 331/158, 116 FE, 331/116 R, 135, 34

(56) References Cited

U.S. PATENT DOCUMENTS 3,911,378 A * 10/1975 Buchanan ............... 331/116 R
6,169,462 B1 * 1/2001 White ........................ 331/158

* cited by examiner

*Primary Examiner*—Arnold Kinkead
(74) *Attorney, Agent, or Firm*—William B. Kempler; W. James Brady; Frederick J. Telecky, Jr.

(57) ABSTRACT

An oscillator controls the frequency of an output clock signal in response to detecting an error in the frequency of an input clock signal. The oscillator includes an inverter operable to generate a voltage signal and a resonator coupled to the inverter operable to introduce a phase shift in the voltage signal. The oscillator also includes a variable resistor positioned across a feedback path of the inverter and operable to introduce a further phase shift in the voltage signal in response to the detected error. The resonator is further operable to adjust the frequency of the voltage signal in response to the introduced further phase shift. The voltage signal is used as the output clock signal.

46 Claims, 1 Drawing Sheet

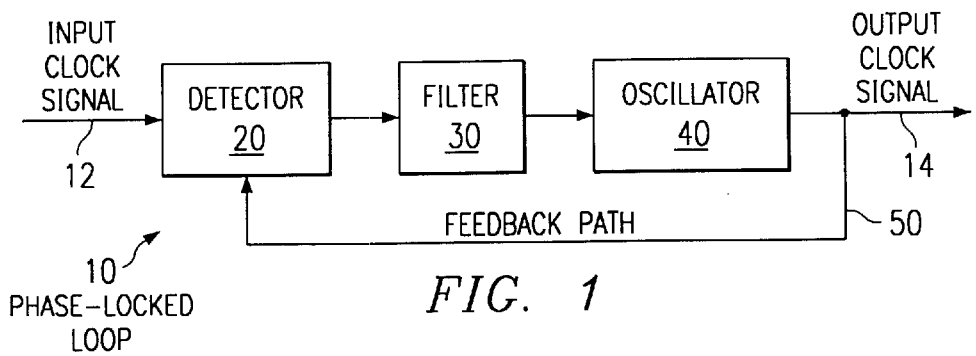
FIG. 1
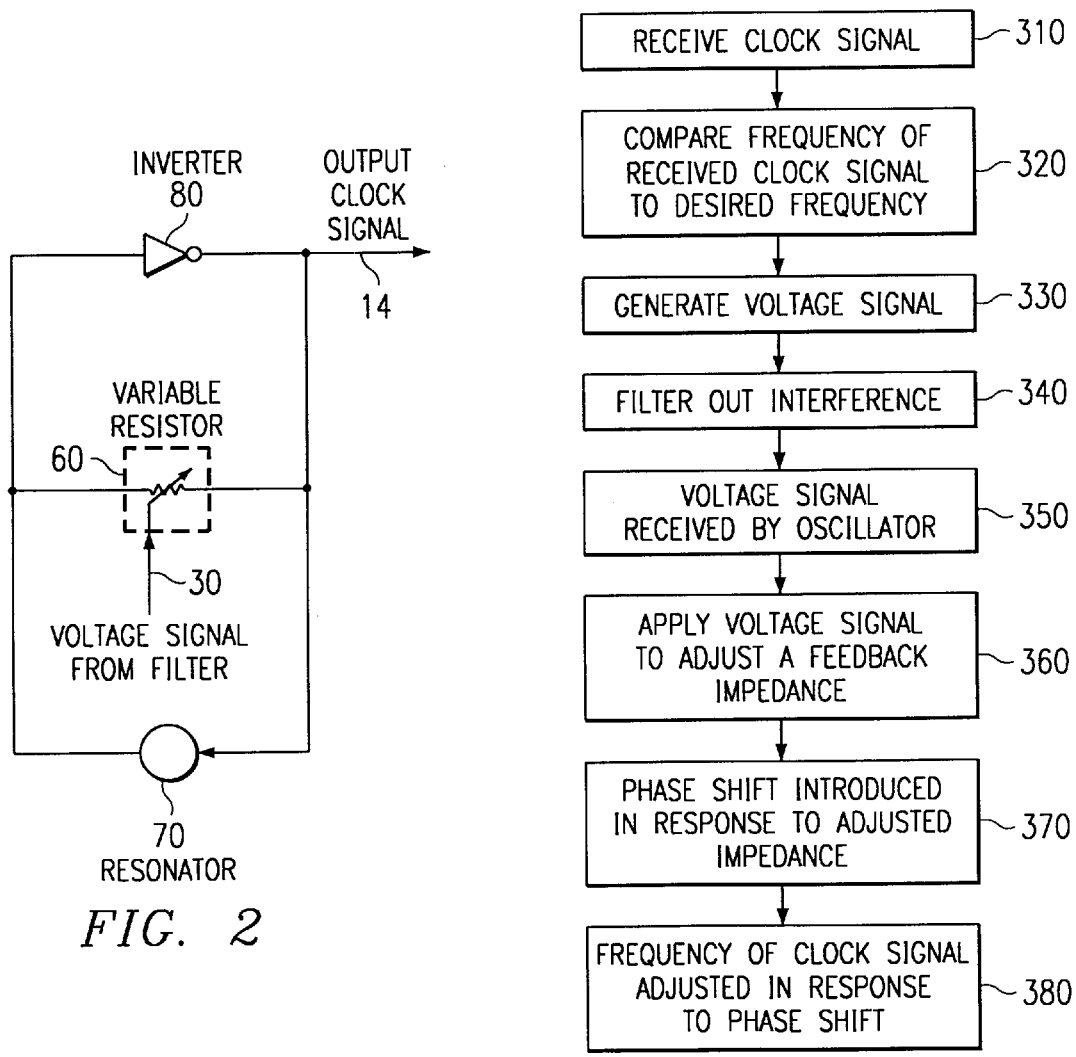
FIG. 2
FIG. 3

US 6,459,342 B1

SYSTEM AND METHOD FOR CONTROLLING AN OSCILLATOR

This application claims priority under 35 USC §119(e)(1) of provisional application No. 60/171,261 filed Dec. 15, 1999.

TECHNICAL FIELD OF THE INVENTION

This invention relates generally to control systems and more particularly to a system and method for controlling an oscillator.

BACKGROUND OF THE INVENTION

Oscillators, such as voltage-controlled crystal oscillators (VCXOs), are widely used in many telecommunications systems. One common use for such oscillators is in clock recovery applications. In particular, oscillators may be used to clean an incoming clock signal in order to better ensure accuracy in reading data transmitted in telecommunications systems.

As the components utilized in telecommunications systems become smaller and more integrated customers want to package as many devices as possible into a single chip solution. For example, network switching components, laptop computers, and cellular telephones are becoming more and more integrated with each successive generation of hardware releases.

Many oscillators currently used in clock recovery applications include an external (off-chip) varactor to vary the phase shift introduced in a voltage-controlled crystal oscillator. Such a phase shift is utilized in order to properly adjust a new frequency for a clock signal during cleaning. The external varactors currently in use may be expensive, may not be easily integrated into standard integration processes or application-specific integrated circuits (ASICS), and may require the use of higher voltage power sources.

SUMMARY OF THE INVENTION

In accordance with the present invention, a system and method for controlling an oscillator are provided that substantially reduce disadvantages and problems associated with previously developed systems and methods.

In one embodiment of the present invention, an oscillator is disclosed for controlling the frequency of an output clock signal in response to detecting an error in the frequency of an input clock signal. The oscillator includes an inverter operable to generate a voltage signal and a resonator coupled to the inverter operable to introduce a phase shift in the voltage signal. The oscillator also includes a variable resistor positioned across a feedback path of the inverter and operable to introduce a further phase shift in the voltage signal in response to the detected error. The resonator is further operable to adjust the frequency of the voltage signal in response to the introduced further phase shift. The voltage signal is used as the output clock signal.

In a second embodiment, a method of adjusting the frequency of a clock signal generated by an oscillator is disclosed. The method includes receiving a voltage input indicative of an error in the frequency of the clock signal and adjusting a feedback impedance across an inverter in response to the received voltage input. The method further includes introducing a phase shift in the voltage output in response to the adjusted feedback impedance and adjusting the frequency of the clock signal in response to the introduced phase shift.

In a third embodiment, a phase-locked loop for adjusting the frequency of a clock signal is disclosed. The phase-locked loop includes a detector operable to detect an error in the frequency of the clock signal and an oscillator coupled to the detector and operable to adjust the frequency of the clock signal in response to the detected error. The oscillator also includes a resonator coupled to an inverter and operable to adjust the frequency of the clock signal in response to a phase shift introduced in a voltage signal by a variable resistor positioned across a feedback path of the inverter.

Technical advantages of the present invention include providing an improved system and method for controlling an oscillator. In particular, embodiments of the present invention may eliminate the additional expense of an external varactor. Additionally, various embodiments of the present invention may allow a system for controlling an oscillator to be more easily integrated with many telecommunications and wireless system applications. A further advantage of various embodiments of the present invention is to allow the use of a lower voltage power supply to control oscillation. Other technical advantages will be readily apparent to one skilled in the art from the following figures, descriptions, and claims.

BRIEF DESCRIPTION OF THE INVENTION

For a more complete understanding of the present invention and its advantages, reference is now made to the following description taken in conjunction with the accompanying drawings, in which:

FIG. 1 is a block diagram of one embodiment of a phase-locked loop control scheme implemented according to the teachings of the present invention;

FIG. 2 is a schematic diagram of an oscillator used in the phase-locked loop of FIG. 1 in accordance with one embodiment of the present invention; and FIG. 3 is a flow chart illustrating a method of controlling an oscillator according to the teachings of one embodiment of the present invention.

DETAILED DESCRIPTION OF THE INVENTION

FIG. 1 illustrates a block diagram of one embodiment of a phase-locked loop 10 that receives an input clock signal 12 and generates a clean output clock signal 14 according to the teachings of the present invention. More particularly, phase-locked loop 10 may receive data at irregular frequencies and intervals such that input clock signal 12 is not clean or consistent. Phase-locked loop 10 cleans input clock signal 12 in order to generate output clock signal 14 which can then be used to re-sample and to retransmit data at a consistent clock frequency.

Phase-locked loop 10 includes a detector 20, a filter 30, and an oscillator 40. Detector 20 may be implemented using two flip-flops and an and gate, or any other suitable combination of components operable to detect a difference in the phase or frequency between input clock signal 12 and output clock signal 14. Detector 20 receives input clock signal 12 and compares it to output clock signal 14 provided via feedback path 50 in order to generate a voltage output indicative of an error in input clock signal 12.

Filter 30 may be a compensation filter, or any other suitable filter operable to filter out noise and pulses in a voltage output received from detector 20. Filter 30 receives the voltage output of detector 20 and filters out pulses or other instabilities in such voltage output signal in order to provide a clean voltage input to oscillator 40.

Oscillator 40 may be a voltage-controlled crystal oscillator, or may be any other suitable oscillator utilizing an inverter and a variable. resistor in the inverter' feedback path in order to introduce a phase shift that results in a correction in the frequency of output clock signal 14. Oscillator 40 receives the filtered voltage output from filter 30 and adjusts the frequency of output clock signal 14 in response to the filtered voltage output. Thus, phase-locked loop 10 compares received input clock signal 12 to output clock signal 14 and utilizes oscillator 40 to correct inconsistencies in input clock signal 12 in order to produce a clean output clock signal 14 such that data may be sampled and read at a consistent frequency. Oscillator 40 may include a variable resistor across an amplifier feedback path, thereby eliminating the need for an external varactor. A particular embodiment of oscillator 40 implemented according to the teachings of the present invention is further described with reference to FIG. 2.

FIG. 2 illustrates a particular embodiment of oscillator 40 implemented according to the teachings of the present invention. Oscillator 40 includes a variable resistor 60, a resonator 70, and an inverter 80. In general, inverter 80 generates and inverts an impulse signal at a particular frequency that it is then filtered and shifted in phase by resonator 70 and further shifted in phase by resistor 60 in order to produce output clock signal 14.

In one embodiment, resistor 60 is a P-channel transistor utilizing the voltage supplied by filter 30 in order to control the feedback resistance across inverter 80; however, resistor 60 may be any transistor or any other suitable element or combination of elements operable to introduce an impedance, whether resistive, capacitive, and/or inductive in nature, across the feedback path of inverter 80 in order to introduce a phase shift in the output signal of inverter 80. Resistor 60 may be selected in order to achieve a particular impedance across the feedback path of inverter 80. For example, in one embodiment, a P-channel transistor may be chosen with a channel ratio of two microns in width to one micron in length. In such a manner, an optimal resistor value can be selected for a particular inverter 80 or desired general application for which oscillator 40 is utilized.

In one embodiment, resonator 70 is a crystal resonator; however, a ceramic resonator or any other suitable resonator may be utilized. In general, a resonator 70 is utilized that has a center frequency near the desired frequency of output clock signal 14. The Q-value, or responsiveness of resonator 70 to a shift in phase in order to modify the frequency of the impulse signal generated by resonator 70, may be selected based on the particular application for which oscillator 40 is utilized. For example, selecting a lower Q-value for resonator 70 may allow phase-locked loop 10 to sample and correct a wider range of inconsistent frequencies of input clock signal 12, but may be less exact in correcting the error of such frequencies. On the other hand, selecting a higher Q-value may detect a lesser range of frequencies of input clock signal 12 but provide a more exact correction of such clock signals when generating out clock signal 14 at a particular frequency.

In one embodiment, inverter 80 is an inverting amplifier; however, inverter 80 may be any suitable device or combination of devices operable to introduce a shift in the phase of the impulse signal generated by resonator 70 in order to achieve oscillation of oscillator 40. An amplifier utilized as inverter 80 may be selected such that its corner frequency, or 3 db frequency, is less than the center frequency of resonator 70. Inverter 80 may also be an amplifier selected such that the gain introduced by the amplifier is greater than the voltage loss across resonator 70.

In operation, inverter 80 generates output clock signal 14 from a noise source, such as, for example, the thermal noise created across an input resistor of inverter 80, which varies in phase from the noise signal by one hundred and eighty degrees. Resonator 70 receives output clock signal 14 from inverter 80 and, in conjunction with parasitic capacitances introduced by device packaging, introduces a one hundred and forty-five degree phase shift in output clock signal 14 in order to generate an impulse signal at the center frequency of resonator 70. Oscillator 40 is implemented such that the phase shift through one complete signal path around oscillator 40 is zero degrees in order to produce an oscillating output clock signal 14. One hundred and forty-five degrees of such phase shift is introduced directly by resonator 70. One-hundred and eighty degrees of such phase shift is introduced by inverter 80. The final forty-five degrees of such phase shift is introduced by resistor 60 disposed across the feedback path of inverter 80.

By varying the filtered voltage signal at the input to resistor 60, the impedance across the feedback path of inverter 80 can be adjusted. Such adjustment is operable to cause the amount of phase shift introduced by the feedback path to vary slightly above or below forty-five degrees. Each fraction of a degree in phase shift introduced by resistor 60 along the feedback path of inverter 80 above or below forty-five degrees causes resonator 70 to change the frequency of a generated impulse signal.

In such a manner, changes in the voltage introduced at the input of resistor 60 can affect the frequency of the generated impulse signal used as output clock signal 14. Thus, oscillator 40 responds to an indicated error in clock signal frequency that is represented by the filtered voltage input signal of resistor 60 by correcting the frequency of output clock signal 14. The amount of frequency change relative to the change in phase shift introduced by resistor 60 above or below forty-five degrees is directly determined by the Q-value of resonator 70. For example, the Q-value of resonator 70 may be a slope of thirty degrees in phase shift over three kilohertz of change in the frequency of the impulse signal generated by resonator 70. Thus, a three degree shift in phase introduced by resistor 60 responding to a change in the filtered input voltage generally result in a .3 kilohertz change in the frequency of the impulse signal generated by resonator 70.

As resistor 60 may be implemented using one or more discrete electronic circuit elements, and does not require an external varactor with its corresponding higher power drain, oscillator 40 offers a preferable alternative to present oscillators for various applications.

Referring to FIG. 3, a flowchart illustrates a method of controlling an oscillator according to one embodiment of the present invention. In step 310, detector 20 receives a clock signal. In step 320, detector 20 compares the frequency of the received clock signal to a desired clock frequency. In step 330, detector 20 generates a voltage in response to the compared frequencies. In step 340, the voltage signal is received by filter 30 and noise such as interference and pulses in the voltage signal are filtered out in order to provide a clean voltage input to oscillator 40. In step 350, oscillator 40 receives the voltage signal from filter 30 and applies the voltage signal in step 360 in order to adjust a feedback impedance across inverter 80. In particular, in step 460 the voltage signal may be applied as a gate voltage of a transistor embodying resistor 60, thereby adjusting the effective resistance of the transistor in order to modify the feedback impedance across inverter 80. In step 370, a phase shift is introduced in a voltage signal as the signal passes through inverter 80. The phase shift is introduced in response to the adjusted feedback impedance across inverter 80. It should be noted that the phase shift introduced in response to the adjusted feedback impedance across inverter 80 is in addition to the phase shift introduced by inverter 80 itself, and the phase shift introduced by resonator 70. In step 380, the frequency of the clock signal is adjusted by resonator 70 in response to the phase shift introduced into the voltage signal in response to the adjusted feedback impedance. In particular, if the total phase shift introduced by resistor 60, resonator 70, and inverter 80 is less than or greater than the three hundred sixty degrees required for oscillator 40 to generate an oscillating clock signal, resonator 70 adjusts the frequency at which such clock signal is generated in response to the difference between the introduced phase shift and three hundred sixty degrees.

Although the present invention and its advantages have been described in detail, it should be understood that various changes, substitutions, and alterations can be made therein without departing from the spirit and scope of the invention as defined by the appended claims.

What is claimed is:

1. An oscillator for controlling the frequency of an output clock signal in response to detecting an error in the frequency of an input clock signal, the oscillator comprising:

an inverter operable to generate a voltage signal;
    a resonator coupled to the inverter operable to introduce a phase shift in the voltage signal; and
    a variable resistor positioned across a feedback path of the inverter and operable to introduce a further phase shift in the voltage signal in response to the detected error, the resonator further operable to adjust the frequency of the voltage signal in response to the introduced further phase shift, the voltage signal operable to be used as the output clock signal.

2. The oscillator of claim 1, wherein the oscillator is a voltage-controlled crystal oscillator and the resonator is a crystal resonator.

3. The oscillator of claim 1, wherein the inverter introduces an additional phase shift in the voltage signal, and wherein the phase shift, the further phase shift, and the additional phase shift are used in combination to introduce three-hundred sixty degrees of phase shift.

4. The oscillator of claim 1, wherein the variable resistor comprises a PMOS transistor having a gate voltage that is adjusted in response to the detected error, and wherein the effective resistance of the PMOS transistor is adjusted in response to the gate voltage being adjusted.

5. The oscillator of claim 1, wherein the inverter comprises an amplifier.

6. The oscillator of claim 1, wherein the resonator is a resonator having a center frequency that is selected in response to a desired frequency of the output clock signal.

7. The oscillator of claim 1, wherein the inverter is an inverting amplifier having a corner frequency that is selected in response to a center frequency of the resonator.

8. A method of adjusting the frequency of a clock signal generated by an oscillator, the method comprising:

receiving a voltage input indicative of an error in the frequency of the clock signal;
    adjusting a feedback impedance across an inverter in response to the received voltage input, wherein adjusting a feedback impedance comprises:
      adjusting the gate voltage of a transistor;
      adjusting the effective resistance of the transistor in response to adjusting the gate voltage; and
      adjusting the feedback impedance in response to adjusting the effective resistance;
    introducing a phase shift in a voltage signal in response to the adjusted feedback impedance; and
    adjusting the frequency of the clock signal in response to the introduced phase shift.

9. The method of claim 8, and further comprising:

receiving the clock signal;
    comparing the frequency of the clock signal to a desired clock frequency; and
    generating the voltage input in response to the compared frequencies.

10. The method of claim 8, wherein adjusting the frequency of the clock signal comprises adjusting the frequency of the clock signal by modifying a frequency of a signal generated by a resonator in response to the introduced phase shift.

11. The method of claim 8, and further comprising detecting the error in the frequency of the clock signal.

12. The method of claim 8, and further comprising:

detecting the error in the frequency of the clock signal; and
    generating the voltage input in response to the detected error.

13. A phase-locked loop for adjusting the frequency of a clock signal, the phase-locked loop comprising:

a detector operable to detect an error in the frequency of the clock signal; and
    an oscillator coupled to the detector and operable to adjust the frequency of the clock signal in response to the detected error, the oscillator including a resonator coupled to an inverter and operable to adjust the frequency of the clock signal in response to a phase shift introduced in a voltage signal by a variable resistor positioned across a feedback path of the inverter.

14. The phase-locked loop of claim 13, wherein the inverter is an amplifier.

15. The phase-locked loop of claim 13, wherein the detector includes two flip-flops and an and gate.

16. The phase-locked loop of claim 13, wherein the oscillator is a voltage-controlled crystal oscillator.

17. The phase-locked loop of claim 13, wherein the variable resistor is a transistor, the transistor operable to introduce an impedance in a feedback path of the inverter, the impedance being introduced in response to a voltage input applied at a gate of the transistor, the voltage input responsive to the detected error, the introduced impedance operable to introduce the phase shift in the voltage signal.

18. The phase-locked loop of claim 13, and further comprising a filter operable to filter pulses in an output signal generated by the detector.

19. The phase-locked loop of claim 13, wherein the resonator is a crystal resonator.

20. An oscillator for controlling the frequency of an output clock signal in response to detecting an error in the frequency of an input clock signal, the oscillator comprising:

an inverter operable to generate a voltage signal;
    a resonator coupled to the inverter operable to introduce a phase shift in the voltage signal; and
    a variable resistor positioned across a feedback path of the inverter and operable to introduce a further phase shift in the voltage signal in response to the detected error, the resonator further operable to adjust the frequency of the voltage signal in response to the introduced further phase shift, the voltage signal operable to be used as the output clock signal, wherein the variable resistor comprises a PMOS transistor having a gate voltage that is adjusted in response to the detected error, and wherein the effective resistance of the PMOS transistor is adjusted in response to the gate voltage being adjusted.

21. The oscillator of claim 20, wherein the oscillator is a voltage-controlled crystal oscillator and the resonator is a crystal resonator.

22. The oscillator of claim 20, wherein the inverter introduces an additional phase shift in the voltage signal, and wherein the phase shift, the further phase shift, and the additional phase shift are used in combination to introduce three-hundred sixty degrees of phase shift.

23. The oscillator of claim 20, wherein the inverter comprises an amplifier.

24. The oscillator of claim 20, wherein the resonator is a resonator having a center frequency that is selected in response to a desired frequency of the output clock signal.

25. An oscillator for controlling the frequency of an output clock signal in response to detecting an error in the frequency of an input clock signal, the oscillator comprising:
   an inverter operable to generate a voltage signal;
   a resonator coupled to the inverter operable to introduce a phase shift in the voltage signal; and
   a variable resistor positioned across a feedback path of the inverter and operable to introduce a further phase shift in the voltage signal in response to the detected error, the resonator further operable to adjust the frequency of the voltage signal in response to the introduced further phase shift, the voltage signal operable to be used as the output clock signal, wherein the inverter is an inverting amplifier having a comer frequency that is selected in response to a center frequency of the resonator.

26. The oscillator of claim 25, wherein the oscillator is a voltage-controlled crystal oscillator and the resonator is a crystal resonator.

27. The oscillator of claim 25, wherein the inverter introduces an additional phase shift in the voltage signal, and wherein the phase shift, the further phase shift, and the additional phase shift are used in combination to introduce three-hundred sixty degrees of phase shift.

28. The oscillator of claim 25, wherein the variable resistor comprises a PMOS transistor having a gate voltage that is adjusted in response to the detected error, and wherein the effective resistance of the PMOS transistor is adjusted in response to the gate voltage being adjusted.

29. The oscillator of claim 20, wherein the resonator is a resonator having a center frequency that is selected in response to a desired frequency of the output clock signal.

30. A method of adjusting the frequency of a clock signal generated by an oscillator, the method comprising:
   receiving a voltage input indicative of an error in the frequency of the clock signal;
   adjusting a feedback impedance across an inverter in response to the received voltage input, wherein adjusting a feedback impedance comprises:
   adjusting the gate voltage of a transistor;
   adjusting the effective resistance of the transistor in response to adjusting the gate voltage; and
   adjusting the feedback impedance in response to adjusting the effective resistance;
   introducing a phase shift in a voltage signal in response to the adjusted feedback impedance; and
   adjusting the frequency of the clock signal in response to the introduced phase shift.

31. The method of claim 30, and further comprising:
   receiving the clock signal;
   comparing the frequency of the clock signal to a desired clock frequency; and
   generating the voltage input in response to the compared frequencies.

32. The method of claim 30, wherein adjusting the frequency of the clock signal comprises adjusting the frequency of the clock signal by modifying a frequency of a signal generated by a resonator in response to the introduced phase shift.

33. The method of claim 30, and further comprising detecting the error in the frequency of the clock signal.

34. The method of claim 30, and further comprising:
   detecting the error in the frequency of the clock signal; and
   generating the voltage input in response to the detected error.

35. A phase-locked loop for adjusting the frequency of a clock signal, the phase-locked loop comprising:
   a detector operable to detect an error in the frequency of the clock signal, wherein the detector includes two flip-flops and an AND gate; and
   an oscillator coupled to the detector and operable to adjust the frequency of the clock signal in response to the detected error, the oscillator including a resonator coupled to an inverter and operable to adjust the frequency of the clock signal in response to a phase shift introduced in a voltage signal by a variable resistor positioned across a feedback path of the inverter.

36. The phase-locked loop of claim 35, wherein the inverter is an amplifier.

37. The phase-locked loop of claim 35, wherein the oscillator is a voltage-controlled crystal oscillator.

38. The phase-locked loop of claim 35, wherein the variable resistor is a transistor, the transistor operable to introduce an impedance in a feedback path of the inverter, the impedance being introduced in response to a voltage input applied at a gate of the transistor, the voltage input responsive to the detected error, the introduced impedance operable to introduce the phase shift in the voltage signal.

39. The phase-locked loop of claim 35, and further comprising a filter operable to filter pulses in an output signal generated by the detector.

40. The phase-locked loop of claim 35, wherein the resonator is a crystal resonator.

41. A phase-locked loop for adjusting the frequency of a clock signal, the phase-locked loop comprising:
   a detector operable to detect an error in the frequency of the clock signal; and
   an oscillator coupled to the detector and operable to adjust the frequency of the clock signal in response to the detected error, the oscillator including a resonator coupled to an inverter and operable to adjust the frequency of the clock signal in response to a phase shift introduced in a voltage signal by a variable resistor positioned across a feedback path of the inverter, wherein the variable resistor is a transistor, the transistor operable to introduce an impedance in the feedback path of the inverter, the impedance being introduced in response to a voltage input applied at a gate of the transistor, the voltage input responsive to the detected error, the introduced impedance operable to introduce the phase shift in the voltage signal.

42. The phase-locked loop of claim 41, wherein the inverter is an amplifier.

43. The phase-locked loop of claim 41, wherein the detector includes two flip-flops and an AND gate.

44. The phase-locked loop of claim 41, wherein the oscillator is a voltage-controlled crystal oscillator.

45. The phase-locked loop of claim 41, and further comprising a filter operable to filter pulses in an output signal generated by the detector.

46. The phase-locked loop of claim 41, wherein the resonator is a crystal resonator.

* * * * *